United States Patent
Ogawa

(10) Patent No.: US 8,720,279 B2
(45) Date of Patent: May 13, 2014

(54) OBJECT DETECTION DEVICE WITH VARIABLE SENSITIVITY ELECTRIC FIELD MEASUREMENT CIRCUIT

(75) Inventor: Shunichi Ogawa, Nagoya (JP)

(73) Assignee: Freescale Semiconductor, Inc., Austin, TX (US)

(*) Notice: Subject to any disclaimer, the term of this patent is extended or adjusted under 35 U.S.C. 154(b) by 458 days.

(21) Appl. No.: 13/104,991

(22) Filed: May 11, 2011

(65) Prior Publication Data
US 2011/0210755 A1   Sep. 1, 2011

Related U.S. Application Data

(63) Continuation-in-part of application No. 12/467,306, filed on May 18, 2009, now Pat. No. 7,984,655.

(30) Foreign Application Priority Data

May 17, 2010 (JP) ................................ 2010-113161

(51) Int. Cl.
*G01L 1/14* (2006.01)
*G01R 27/26* (2006.01)

(52) U.S. Cl.
USPC ........ 73/780; 73/862.626; 324/663; 324/658; 324/686; 324/688; 702/65

(58) Field of Classification Search
USPC ................... 324/663, 658, 686, 688; 73/780, 73/862.626, 774; 702/65
See application file for complete search history.

(56) References Cited

U.S. PATENT DOCUMENTS

| | | | | |
|---|---|---|---|---|
| 5,551,288 | A * | 9/1996 | Geraldi et al. | 73/170.26 |
| 6,404,074 | B2 * | 6/2002 | Saito et al. | 307/10.1 |
| 6,960,841 | B2 * | 11/2005 | Saitou et al. | 307/10.1 |
| 7,132,642 | B2 | 11/2006 | Shank | |
| 7,464,980 | B2 | 12/2008 | Gutendorf | |
| 7,548,809 | B2 | 6/2009 | Westerhoff | |
| 7,714,595 | B2 | 5/2010 | Fujiwara | |
| 8,156,826 | B2 * | 4/2012 | Abert et al. | 73/862.626 |
| 2005/0012484 | A1 | 1/2005 | Gifford | |
| 2009/0223288 | A1 | 9/2009 | Veerasamy | 73/170.17 |
| 2009/0256578 | A1 * | 10/2009 | Wuerstlein et al. | 324/601 |
| 2009/0314098 | A1 | 12/2009 | Ogawa | |
| 2010/0050787 | A1 * | 3/2010 | Abert et al. | 73/862.626 |
| 2010/0156440 | A1 * | 6/2010 | Weingartner et al. | 324/658 |
| 2010/0182018 | A1 * | 7/2010 | Hazelden | 324/663 |
| 2010/0242587 | A1 * | 9/2010 | Veerasamy | 73/170.17 |
| 2010/0292945 | A1 * | 11/2010 | Reynolds et al. | 702/65 |
| 2010/0295559 | A1 * | 11/2010 | Osoinach | 324/658 |
| 2010/0301880 | A1 * | 12/2010 | Stanley et al. | 324/686 |

FOREIGN PATENT DOCUMENTS

| | | |
|---|---|---|
| JP | 2003-148046 | 5/2003 |
| JP | 2003-336448 | 11/2003 |
| JP | 2007-009456 | 1/2007 |

* cited by examiner

*Primary Examiner* — Lisa Caputo
*Assistant Examiner* — Jonathan Dunlap
(74) *Attorney, Agent, or Firm* — Charles Bergere

(57) ABSTRACT

Three or more electrodes are arranged on either a window frame or window glass of an automobile. An electric field measurement unit measures the capacitance between various combinations of the electrodes to detect whether an object is located between the window frame and window glass. A control circuit varies the sensitivity of the electric field measurement unit by switching amongst the electrodes used for capacitance measurement based on the movement and position of the window glass.

14 Claims, 11 Drawing Sheets

OBJECT DETECTION DEVICE WITH VARIABLE SENSITIVITY ELECTRIC FIELD MEASUREMENT CIRCUIT

BACKGROUND OF THE INVENTION

The present invention relates to an object detection device with a variable sensitivity electric field measurement function and, more particularly, to an entrapment prevention device using the object detection device.

Conventionally, devices have been used to prevent entrapment of the hand, head, or other human body part from being trapped in a vehicle power window device or building automatic door. For example, in power window devices equipped with an entrapment prevention device, when a foreign object is located between the window glass and window frame when the window is closing, the window closing operation is stopped so that the foreign object is not trapped therebetween. Recently, it has been suggested to implement an entrapment detection device based on static capacitance measurements.

JP Patent Publication No. 2001-32628 describes a static capacitance detection unit of a conventional entrapment prevention means. The conventional entrapment prevention means measures the static capacitance formed between the window glass and the sensor electrodes provided in the window frame, and if the measured capacitance exceeds a reference static capacitance, the entrapment of a foreign object is detected. However, in this configuration, as the static capacitance generated when the object is trapped between the window frame and glass is set as the reference static capacitance, the foreign object is only detected when it is actually trapped. In other words, for this device, as the foreign object being in contact with the window glass is the premise for entrapment detection, the accuracy of entrapment detection depends on the reference static capacitance. For this reason, regardless of whether entrapment occurs, the device is unable to appropriately detect entrapment. Furthermore, if the size of the foreign object is rather large, entrapment is only detected after a large force is applied to the foreign object.

JP Patent Publication No. 2010-1637 describes another example of a prior art entrapment prevention device. This device uses a static capacitance sensor to detect an object in a non-contact manner. The static capacitance sensor detects an increase in static capacitance when a foreign object (a person's body part, etc.) is placed between two electrodes. When the varied amount of the capacitance exceeds a fixed value, the device determines that a foreign object is near a closing movable object (a glass window, etc.) and stops the movable object or initiates opening of the movable object. As the foreign object is detected beforehand, entrapment is prevented.

However, the device of Reference 2 may be overly sensitive in the detection of foreign objects. For example, when a window glass is closing due to rain, the static capacitance sensor may be overly sensitive to the rain drops, that is, mistaking the rain drops as foreign objects and stopping the closing of the window and even opening the window. For this reason, maintaining good detection accuracy while preventing undesired movement of the movable object are grounds for improvement for the prior art entrapment prevention device.

It is an object of the present invention to provide an object detection device that has good detection accuracy when a foreign object is near a movable object yet is not overly sensitive.

DETAILED DESCRIPTION OF THE INVENTION

According to one aspect of this invention, an object detection device that detects an object between a moving movable object and a frame is provided. A first plurality of more than three sensors is located in at least one direction of the frame and movable object. An electric field measurement unit connected to the first plurality of sensors measures the static capacitance between two arbitrary electrodes of the first plurality of electrodes to detect the object. A control circuit connected to the electric field measurement unit varies the sensitivity of the electric field measurement unit by switching between two electrodes of the first plurality of electrodes in response to movement of the movable object.

In another embodiment, an entrapment prevention device that prevents entrapment of the foreign object between a moving movable object and a frame is provided. A driving unit causes the movable object to move relative to the frame. A first plurality of more than three electrodes is placed in at least one direction of the movable object and frame. An electric field measurement unit connected to the first plurality of sensors measures the static capacitance between two arbitrary electrodes of the first plurality of electrodes to detect the object. A control circuit connected to the electric field measurement unit varies the sensitivity of the electric field measurement unit by switching which two electrodes are for measurement in response to the movement of the movable object.

The object detection device of the present invention is very accurate yet not overly sensitive such that it mistakes a foreign object such as a raindrop as an object that causes stopping and/or reversing the closing movement of the movable body.

One embodiment of the object detection device and the entrapment prevention device equipped in a power window device for an automobile 10 will now be described with reference to FIGS. 1-13.

Figure 1:
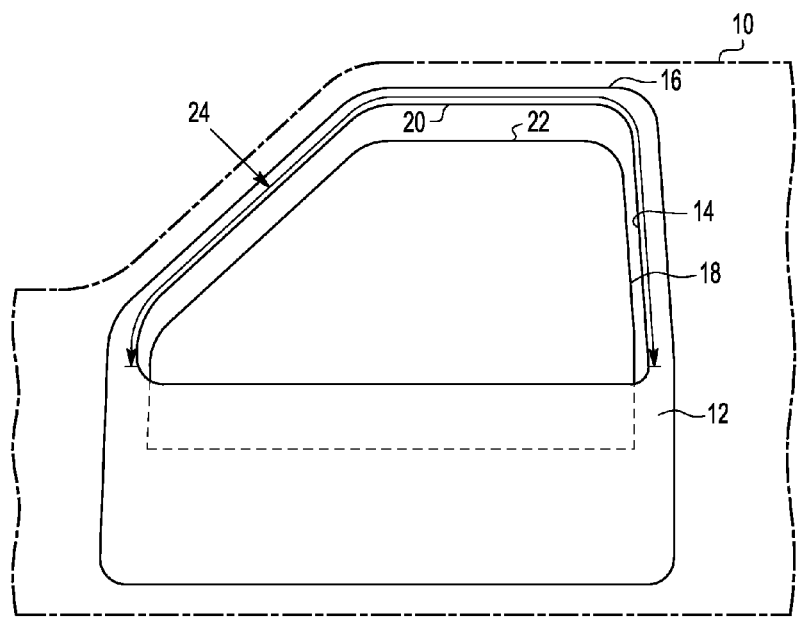
FIG. 1 is a schematic side view showing a window on a window frame of an automobile.

As shown in FIG. 1, an automobile 10 has a door 12 with a window frame 16 that defines a window area 14 (empty space), and a window glass 18 (movable body). The window frame 16 has an inner surface 20 that comes into contact with the window glass 18, and the window glass 18 has a periphery 22 that contacts the window frame 16. When the periphery 22 of the window glass 18 is in contact with the inner surface 20 of the window frame 16, the window 14 is completely closed.

Figure 2:
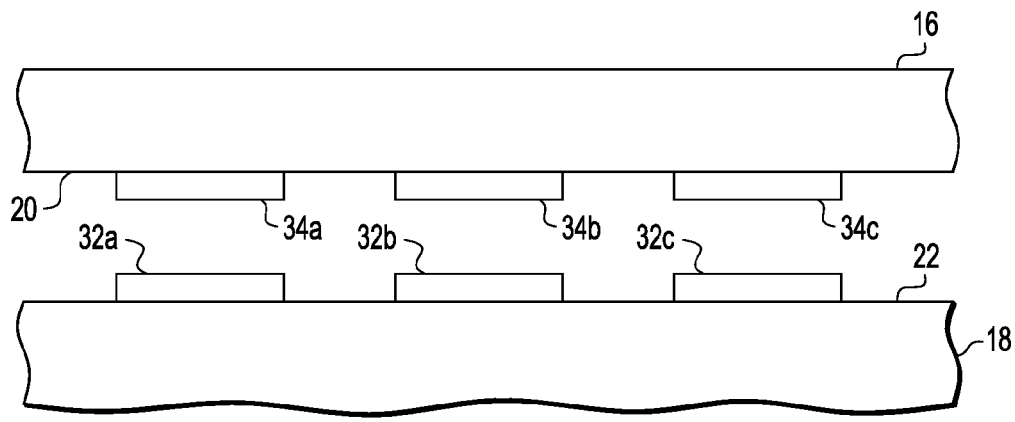
FIG. 2 is an enlarged view of when an electrode is placed in both directions of the window glass and window frame shown in FIG. 1.

As shown in FIG. 2, a plurality of first electrodes 32 are placed on the periphery 22 of the window glass 18 for use with a static capacitance sensor (also referred to as an electric field sensor). Although only three electrodes 32*a*, 32*b*, and 32*c* are shown in FIG. 2, it is to be understood that more than three electrodes may be used. The electrodes 32 are arranged at predetermined intervals on the periphery 22 of the window glass 18 in a range 24 (see FIG. 1) where the window glass 18 contacts the inner surface 20 of the window frame 16. Similarly, a corresponding plurality of second electrodes 34 for use with the static capacitance sensor is located on the inner surface 20 of the window frame 16. The electrodes 34 are arranged at predetermined intervals on the inner surface 20 of the window frame 16 in the range 24. The electrodes 32 of the window glass 18 and the electrodes 34 of the window frame 16 are preferably arranged to be substantially opposed to each other when in a proximate state.

Figure 3:
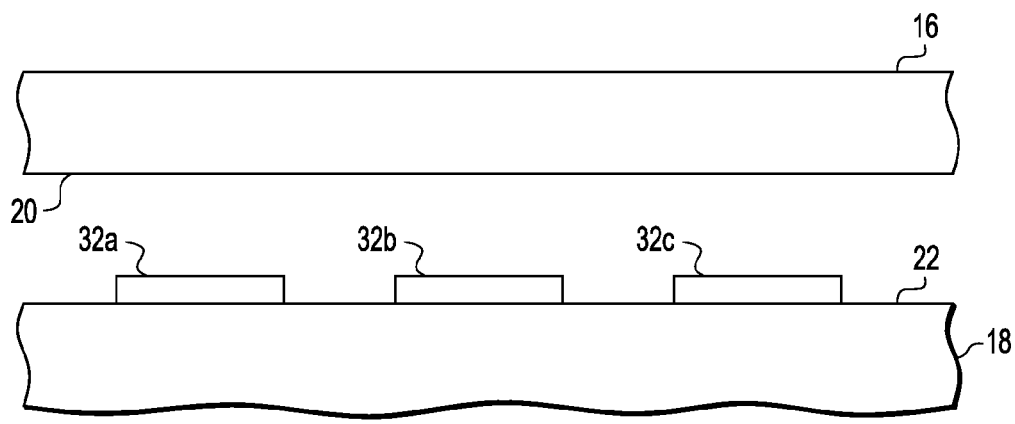
FIG. 3 is an enlarged view of when an electrode is placed only on the window glass as shown in FIG. 1.
Figure 4:
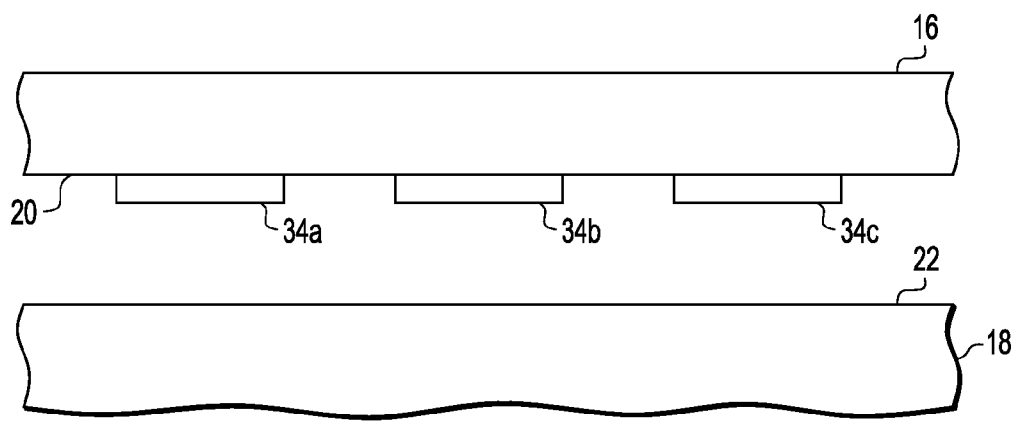
FIG. 4 is an enlarged view of when an electrode is placed only on the window frame as shown in FIG. 1.
Figure 5:
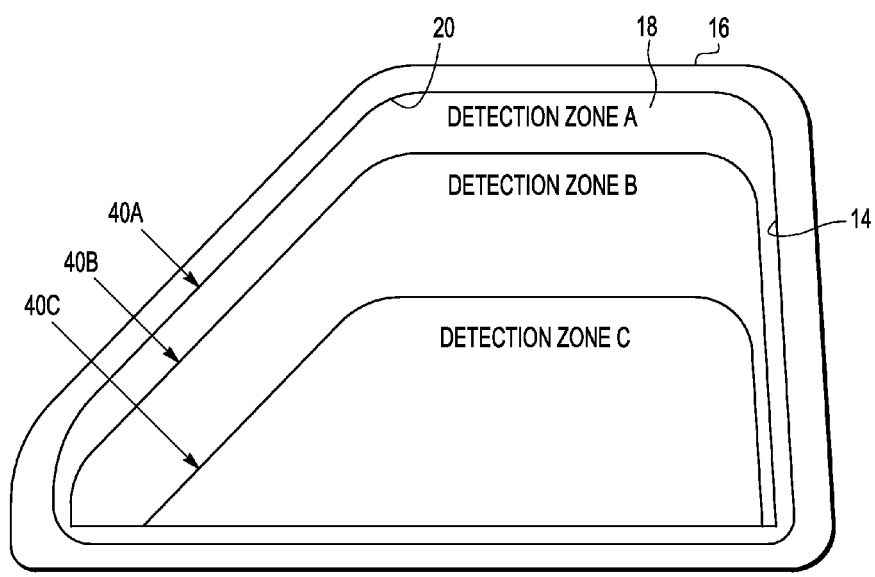
FIG. 5 is an explanatory diagram showing one example of the plurality of detection zones provided in the window.

FIGS. 3 and 4 show another embodiment of the electrodes. More particularly, FIG. 3 shows electrodes 32 (i.e., 32*a*, 32*b*, 32*c*) located only on the periphery 22 of the window glass 18 and FIG. 4 shows electrodes 34 (i.e., (34*a*, 34*b*, 34*c*) located only on the inner surface 20 of the window frame 16. In this manner, the electrodes 32 or 34 are only located on either one of the window glass 18 and the window frame 16, however for higher object detection accuracy (entrapment detection accuracy), it is preferable to place electrodes on both of the window glass 18 and the window frame 16 as shown in FIG. 2. In the embodiment described hereafter, electrodes are arranged on both of the window frame 16 and the window glass 18.

In one embodiment of the invention, the electrodes 32 and 34 are generally square shaped and formed from thin conductive and transparent membranes such as ITO (Indium Tin Oxide). However, the present invention is not limited to this particular shape and material of electrodes.

In order to achieve high accuracy, the static capacitance sensor of the present invention includes four detection modes. In each detection mode, different combinations of the pluralities of the first and second electrodes 32, 34 are selected and the static capacitance between the selected electrodes 32, 34 is measured. The selected electrodes may be opposing electrodes, e.g., 32*a* and 34*a*, or non-opposing electrodes, such as 32*a* and 34*c*. Note that one of the electrodes functions as a positive electrode and the other as a negative electrode.

The four detection modes will now be explained. The first detection mode is the "parallel electrode mode". In the parallel electrode mode, the static capacitance sensor selects two opposing ones of the electrodes 32 and 34, and measures the static capacitance between the two selected electrodes, for example, electrodes 32*a* and 34*a*. If an object is disposed between the selected electrodes there is an increase in static capacitance that is detected by the selected electrode pair. This increase in the static capacitance exceeds a predetermined threshold value indicating that an object exists between the electrodes 32*a* and 34*a*.

The second mode is the "horizontal electrode mode", where two adjacent electrodes 32 on the window glass 18 or two adjacent electrodes 34 on the window frame are used, for example, electrodes 32*a* and 32*b* are selected. Again, the static capacitance sensor measures the static capacitance between the two selected electrodes 32*a* and 32*b* and if the measured capacitance varies or exceeds a predetermined threshold, the variation is an indication that an object exists between or proximate to the selected electrodes. In using this horizontal electrode mode, the distance between the two electrodes of each electrode group is fixed. That is, even if the window glass 18 is moving, the distance between the selected adjacent electrodes does not change; which is in contrast with the parallel electrode mode where as the window glass 18 closes, the distance between the selected electrodes decreases.

The third mode is the "variable sensitivity horizontal electrode mode". In the variable sensitivity horizontal electrode mode, two nonadjacent electrodes from the same electrode group are used, for example, electrodes 32*a* and 32*c*. Otherwise, the process is the same as the above-described horizontal electrode mode. When the distance between the electrodes doubles, the measured static capacitance is halved. Note that the greater the distance between the selected electrodes, the lower the sensitivity of the static capacitance, i.e. the detection accuracy.

The fourth mode is the "single electrode mode". In the single electrode mode, one of the electrodes 32 and 34 is chosen, for example, just electrode 32*a*. The object to be detected in this case acts as the electrode opposing the selected single electrode. Thus, if no object exists within the vicinity of the selected single electrode, no electric field is formed.

An electric field is formed between two opposing electrodes in the parallel electrode mode (first detection mode), and an electric field is formed between the two laterally located electrodes in the horizontal electrode mode (second detection mode) and the variable sensitivity horizontal electrode mode (third detection mode). The sensor detects changes in the capacitance between the selected electrodes. For this reason, the parallel electrode mode has the highest sensitivity to an object that enters the window area 14 while and the horizontal and variable sensitivity horizontal electrode mode are a bit less sensitive to the detection of an object that enters the window area 14.

The present invention also provides for a plurality of detection zones. In the following description, three detection zones will be described. However, it should be understood that three zones is illustrative and more or less zones may be defined. An example of a plurality of detection zones A, B, and C defined in the window 14 shown in FIG. 5 will now be explained. Detection zone means the area where window glass 18 is located in the window 14. In one embodiment, this detection zone is determined when the window glass 18 is closing, and the detection mode is selected according to the determined detection zone.

The first detection zone C is the area when the window glass 18 moves from the most distant position of window frame 16 (i.e. window 14 is completely open) to a first closing position 40C. The first detection zone C preferably implements the variable sensitivity horizontal electrode mode using electrodes 34 on the window frame 16. The distance between two of the electrodes 34 (i.e. the static capacitance sensor's sensitivity) may be fixed in the first detection zone C, however, whenever the window glass 18 moves upwards by a predetermined distance, it is preferred that the distance between the two electrodes 34 be decreased.

When the window glass 18 is in the first detection zone C (particularly in the completely open position or a position in that proximity), the required sensitivity is not high because the probability of entrapment is low. Thus, in the first detection zone, the sensitivity is set to the lowest of all the detection zones. By setting the sensitivity to low in the first detection zone C, over-sensitive detecting of objects is prevented. Furthermore, use of the electrodes 34 on the window frame 16 prevents tiny objects such as raindrops from giving a false indication of entrapment of a foreign object.

The second detection zone B is the area when the window glass 18 moves from the first closing position 40C to the first closing position 40B. The second detection zone B preferably uses the variable sensitivity horizontal electrode mode, using the electrodes 32 provided on window glass 18. The distance between two of the electrodes 32 (i.e. the static capacitance sensor's sensitivity) may be fixed in the second detection zone B, however, whenever the window glass 18 moves upwards by a predetermined distance, it is preferred that the distance between the two electrodes 32 be decreased. As the chance of entrapment in the second detection zone B is greater than in the first detection zone C, the static capacitance sensor's sensitivity is set to be higher than for the first detection zone C. By doing so, good accuracy in detecting foreign objects is maintained and over-sensitivity of foreign object detection is prevented. Furthermore, since the electrodes 32 on the window glass 18 are used in the second detection zone B, the static capacitance sensor detects objects near the window glass 18. Thus, objects such as hands, and fingers near to the periphery 22 of the window glass 18 are detected.

The third detection zone A is the area where the window glass 18 moves from the second closing position 40B to the closed position 40A (i.e. the window 14 is completely closed). It is preferred to use the parallel electrode mode in the third detection zone A because, as stated above, the parallel electrode mode has higher sensitivity than the variable sensitivity horizontal electrode mode. Thus, an object between the window glass 18 and window frame 16 is accurately detected in the third detection zone A.

Figure 6:
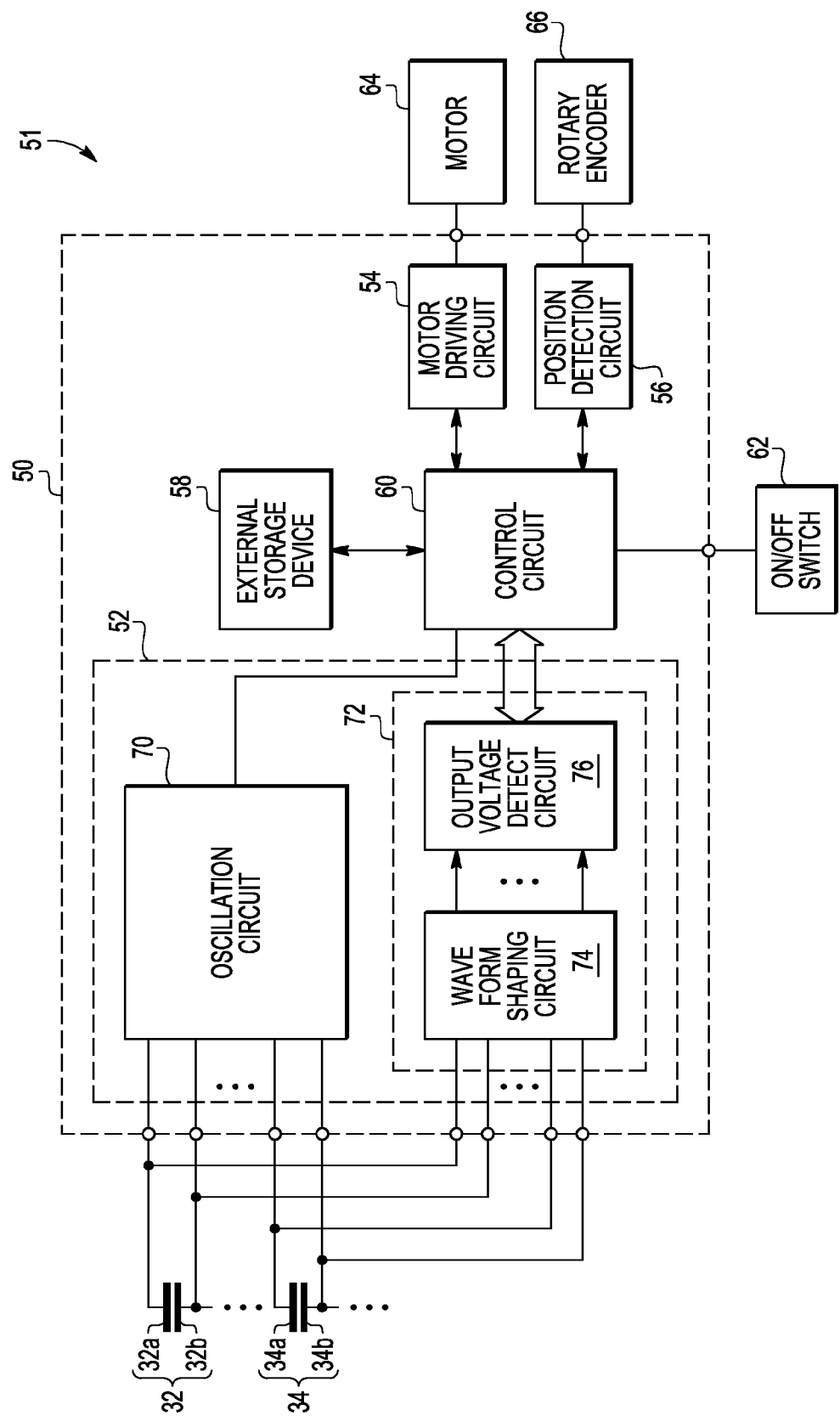
FIG. 6 is a schematic block circuit diagram showing one embodiment of the object detection device (entrapment prevention device)

FIG. 6 is a schematic block circuit diagram of one embodiment of an object detection device 50 of an (entrapment prevention device 51.

The object detection device 50 comprises an electric field measurement unit 52, motor driving circuit 54, position detection circuit 56, external memory device 58, and a control circuit 60 connected to the external memory device 58. The control circuit 60 is connected to an ON/OFF switch 62 that is operable by a user (e.g., driver or passenger in the automobile) to open and close the window glass 18. The control circuit 60 may be a microcomputer, microcontroller or embedded processor that includes a processing unit, ROM, and RAM, as are known in the art. The electric field measurement unit 52, motor driving circuit 54, position detection circuit 56, and external memory device 58 are controlled by application and control programs (software) stored in the ROM and RAM. According to one embodiment, the detection mode for each of the detection zones A-C and the combined patterns of the selected two electrodes used in each detection mode are stored in the RAM or ROM of the control circuit 60.

The control circuit 60 controls the motor driving circuit 54 in response to an open or close signal from the switch 62. The motor driving circuit 54 is connected to a motor 64, which serves as an actuator for moving the window glass 18 based on a drive control signal from the control circuit 60. According to one embodiment, the motor 64 rotates in a first direction to move the window glass 18 downward (closed to opened) and rotates in a second, opposite direction to move the window 18 upward (open to closed position).

The position detection circuit 56 is connected to a rotary encoder 66, which serves as a position sensor that detects the position of the window glass 18 within the window frame 16. The rotary encoder 66 is provided on the motor 64. The position detection circuit 56 receives the movement direction of the window glass 18 based on a detection signal from the rotary encoder 66. According to one embodiment, the rotary encoder 66 generates two rectangular wave signals (detection signals) having a 90° phase shift difference, between predetermined amounts of rotation of the motor 64. The position detection circuit 56 determines whether the motor 64 is rotating forwards or backwards by comparing the two rectangular wave signals and generates data indicating the movement direction of the window glass 18. This movement direction data is provided to control circuit 60 and temporarily stored in the external memory device 58.

The position detection circuit 56 also includes an addition/subtraction counter (not shown) and determines the position of the window glass 18 by addition/subtraction of a count value based on pulses from one of the two rectangular wave signals. For example, the addition/subtraction counter increments the count value between received rectangular wave signals while the window glass 18 is opening and decrements the count value between rectangular wave signals when the window glass 18 is closing. The position detection circuit 56 then generates the position data using the count value. This position data is provided to the control circuit 60 and temporarily stored in the external memory device 58.

The electric field measurement unit 52 is connected to the electrodes 32 and 34 provided on the window glass 18 and window frame 16. The electric field measurement unit 52 acts as a single static capacitance sensor by using different combinations of any two of the electrodes 32 and 34.

The electric field measurement unit 52 includes an oscillation circuit 70 and a static capacitance detection unit 72. The oscillation circuit 70 specifies the electrode group (i.e., sets which two electrodes are used for detection) used for the above-mentioned detection modes based on a control signal from the control circuit 60, and provides a predetermined alternating signal (for example a sine wave signal) to the two electrodes. The static capacitance detection unit 72 detects the static capacitance between the two specified electrodes based on the phase shift and amplitude variation of the sine wave signal provided to the selected electrodes. The static capacitance varies according to the distance between and dielectric constant of the two selected electrodes.

According to one embodiment, the static capacitance detection unit 72 includes a waveform shaping circuit 74 and an output voltage detection circuit 76. The waveform shaping circuit 74 includes a full-wave rectifier and a low pass filter. The full-wave rectifier receives a varying sine wave voltage from the electrodes in response to the static capacitance between the electrodes and full-wave rectifies the sine wave voltage. The low-pass filter receives the sine wave voltage via the full-wave rectifier, converts the sine wave voltage to a DC voltage, and smoothes the DC ripples. By doing so, the waveform shaping circuit generates the DC voltage in accordance with the value of the static capacitance.

The output voltage detection circuit 76, which includes an A/D converter, converts the DC voltage provided by the waveform shaping circuit 74 to a digital value. This digital value is provided as static capacitance data to the control circuit 60 and also is temporarily stored in the external memory device 58 by the control circuit 60.

The control circuit 60 calculates the movement distance in the present movement direction of the window glass 18 based on the position data and movement direction data generated by the position detection circuit 56. The control circuit 60 also receives the static capacitance (digital value) between the selected two electrodes from the static capacitance detection unit 72. In one embodiment, the control circuit 60 receives the static capacitance whenever the movement distance of the window glass 18 reaches a predetermined reference distance. This static capacitance is then temporarily stored in the external memory device 58 by the control circuit 60.

When the window glass 18 is closing, the control circuit 60 compares the present static capacitance C, received from the static capacitance detection unit 72 with the previous static capacitance $C_n$-1 stored in the external memory device 58. This comparison is performed whenever the control circuit 60 receives a new static capacitances C, from the static capacitance detection unit 72. Thus, the control circuit 60 determines whether an object (human body part, etc.) is near the window glass 18 or the window frame 16 whenever the moving distance of the closing window glass 18 reaches the predetermined reference distance. At this time, if the calculated difference value obtained by subtracting the previous static capacitance $C_n$-1 from the present static capacitance $C_n$ is greater than a predetermined threshold value, the control circuit 60 determines there is an object between the window glass 18 and window frame 16. The threshold value is preferably set to a different value for each detection mode, and more preferably also varies in accordance with the detection zone.

If control circuit 60 detects a foreign object, the motor driving circuit 54 generates a drive control signal and provides it to the motor 16 to reverse rotation of the motor and thus change the moving direction of the window glass 18, thereby lowering the window glass 18 until the window 14 is in a completely open state. As a result, the entrapment of a foreign object such as a human body part between the window glass 18 and window frame 16 is prevented.

Next, referring to FIGS. 7-10, an entrapment prevention process performed by the control circuit 60 will be described. In one embodiment, the entrapment prevention process begins when the automobile 10 electrical system is turned on (providing power to the control circuit 60).

Figure 7:
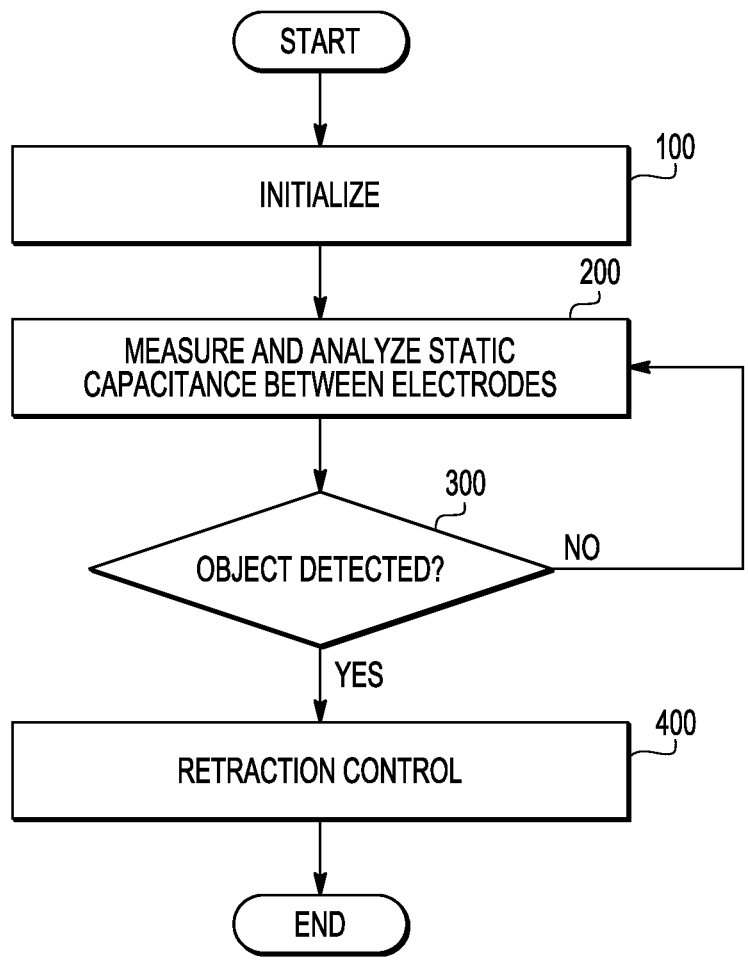
FIG. 7 is a flow chart showing one embodiment of an entrapment prevention process of the present invention.
Figure 8:
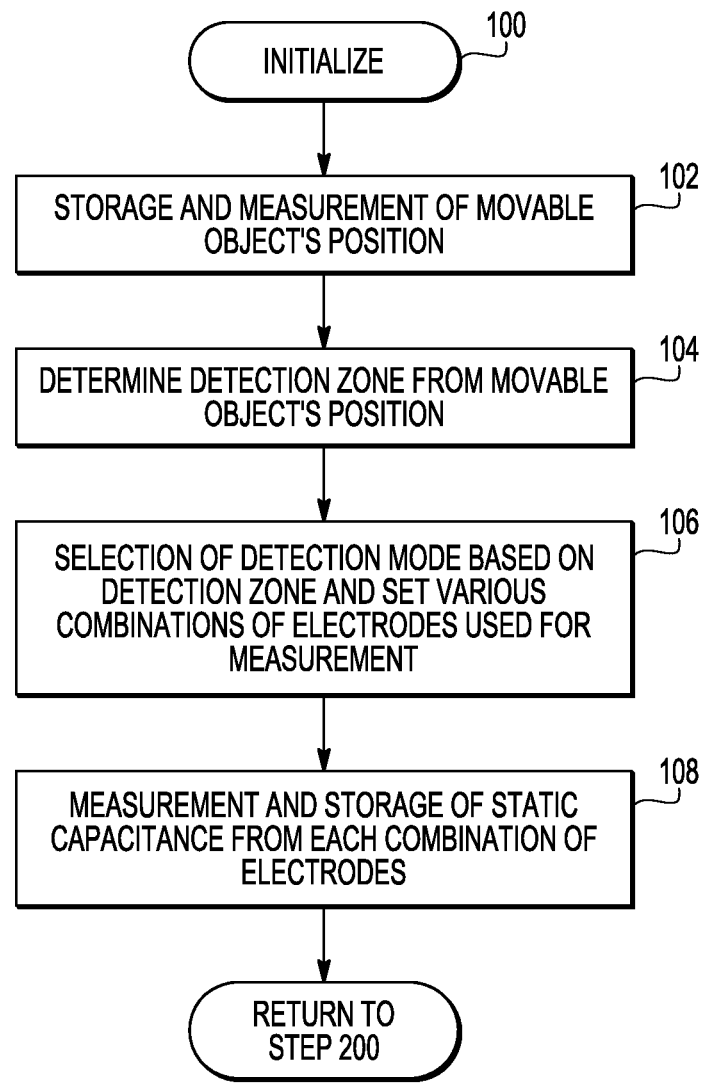
FIG. 8 is a flow chart showing an initial step of FIG. 7.

As shown in FIG. 7, the control circuit 60 performs initialization in step 100. FIG. 8 shows the details of the initialization process. As shown in FIG. 8, in step 102, the control circuit 60 measures the current position of the glass 18 (moving object) with the position detection circuit 56 and stores the current position. Next in step 104, the control circuit 60 determines the detection zone based on the current position of glass 18. In other words, control circuit 60 determines in which one of the detection zones A-C the glass 18 is located. In step 106, the control circuit 60 selects the detection mode based on the determined detection zone and sets all the combinations of the electrodes (sets of two electrodes) selected from electrodes 32 and 34 used for the determined detection mode. In step 108, for each combination of two electrodes, the control circuit 60 measures the static capacitance between the two electrodes in each set with the electric field measurement unit 52 and stores the measured static capacitances.

Figure 9:
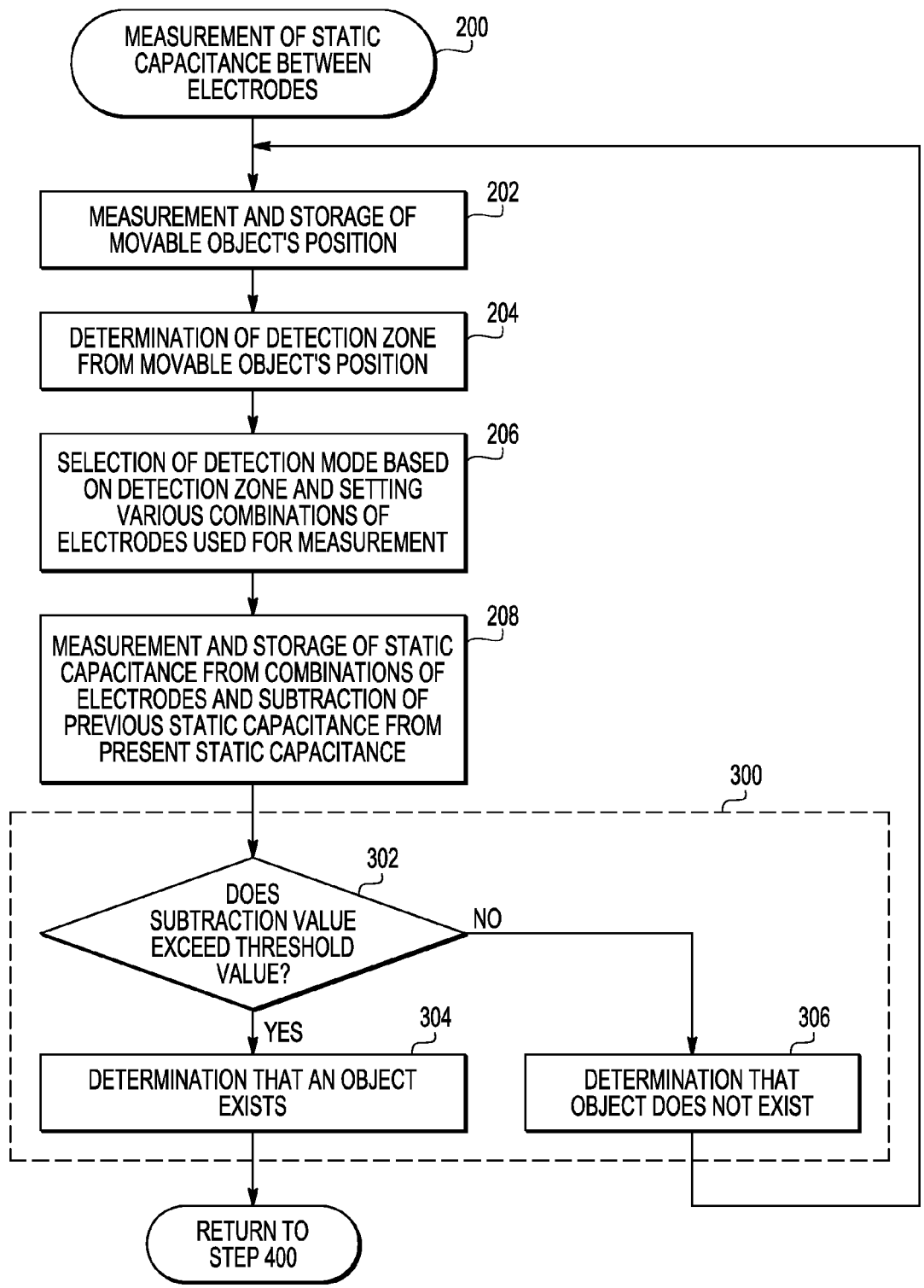
FIG. 9 is a flow chart showing the measurement and analysis step of FIG. 7.

After the initialization step has completed, in step 200 (refer to FIG. 7), the control circuit 60 sequentially carries out the measurement and analysis of the static capacitances while the glass 18 is moving upwards. FIG. 9 shows the detailed process of the measurement and analysis performed by the control circuit 60.

As shown in FIG. 9, in step 202, the control circuit 60 measures the current position of the glass 18 (moving object) with the position detection circuit 56 and stores the position information. In one embodiment, step 202 is performed whenever the distance moved by the closing glass 18 reaches the predetermined reference distance.

Next in step 204, the control circuit 60 determines the detection zone from the current position of the glass 18. Next in step 206, the control circuit 60 selects the detection mode based on the determined detection zone and sets all the combinations of the electrodes (sets of two electrodes) selected from electrodes 32 and 34 used for the determined detection mode. In step 208, for each combination of two electrodes, the control circuit 60 measures the static capacitance between the two electrodes with the electric field measurement unit 52 and stores the measured static capacitance information. The control circuit 60 also subtracts the previous static capacitance $C_{n-1}$ from the current static capacitance C, and obtains a subtraction value.

In step 300, the control circuit 60 determines whether a foreign object (human body part, etc.) exists between the glass 18 and the window frame 16 based on the subtraction value obtained in step 208. More specifically, in step 302, the control circuit 60 determines whether the subtraction value exceeds the set threshold value. The ROM has a plurality of prestored threshold values, and the control circuit 60 performs the determination process of step 302 by reading the threshold value corresponding to the present detection mode (or detection zone) from the ROM.

When the subtraction value exceeds the threshold, the control circuit 60 determines an object exists between the glass 18 and the window frame 16 (step 304). If the subtraction value does not exceed the threshold value, the control circuit 60 determines that no object exists between the glass 18 and the window frame 16 (step 306). If no object is detected between the glass 18 and the frame 16, the process returns to step 202. Hence, the control circuit 60 waits until the glass 18 has moved a predetermined reference distance and into the next detection zone.

Figure 10:
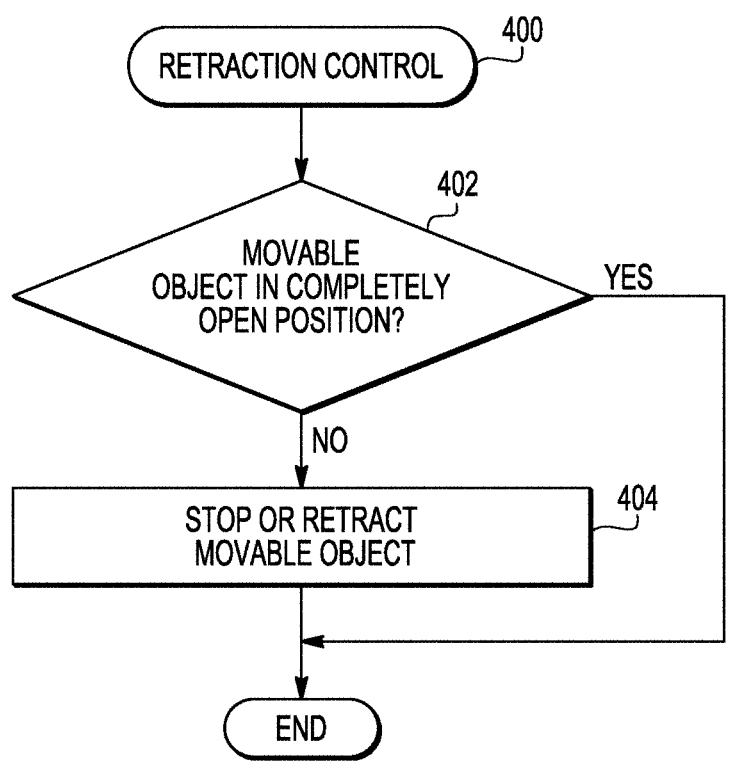
FIG. 10 is a flow chart showing the removal control step of FIG. 7.

When an object has been detected, in step 400, the control circuit 60 performs a retraction control of the glass 18 (refer to FIG. 7). FIG. 10 shows the details of the retraction control step. As shown in FIG. 10, first in step 402, the control circuit 60 determines whether the glass 18 is in the completely open position. This determination process of step 402 is confirmed by the count value of the addition/subtraction counter of the position detection unit 56.

When the glass 18 is not in the completely open position, in step 404, the control circuit 60 retracts the glass 18. That is, in FIG. 10, the control circuit 60 lowers the glass 18 to the completely open position. By doing so, the entrapment of a foreign object between the glass 18 and the window frame 16 is prevented. Alternatively, the control circuit 60 may also just simply stop the w glass 18 from moving. When the glass 18 is in the completely open position, the control circuit 60 ends the process.

Figure 11:
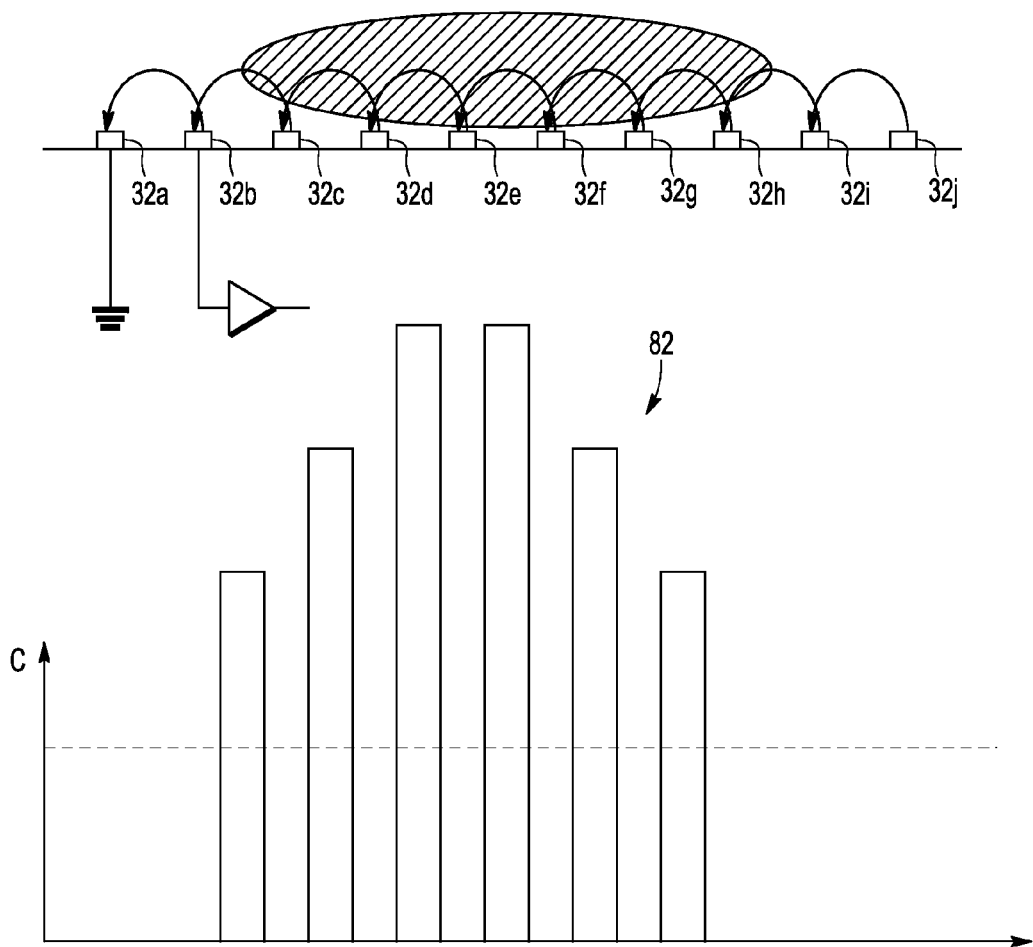
FIG. 11 is an explanatory diagram showing one example of using a plurality of electrodes to generate static capacitance distribution.
Figure 12:
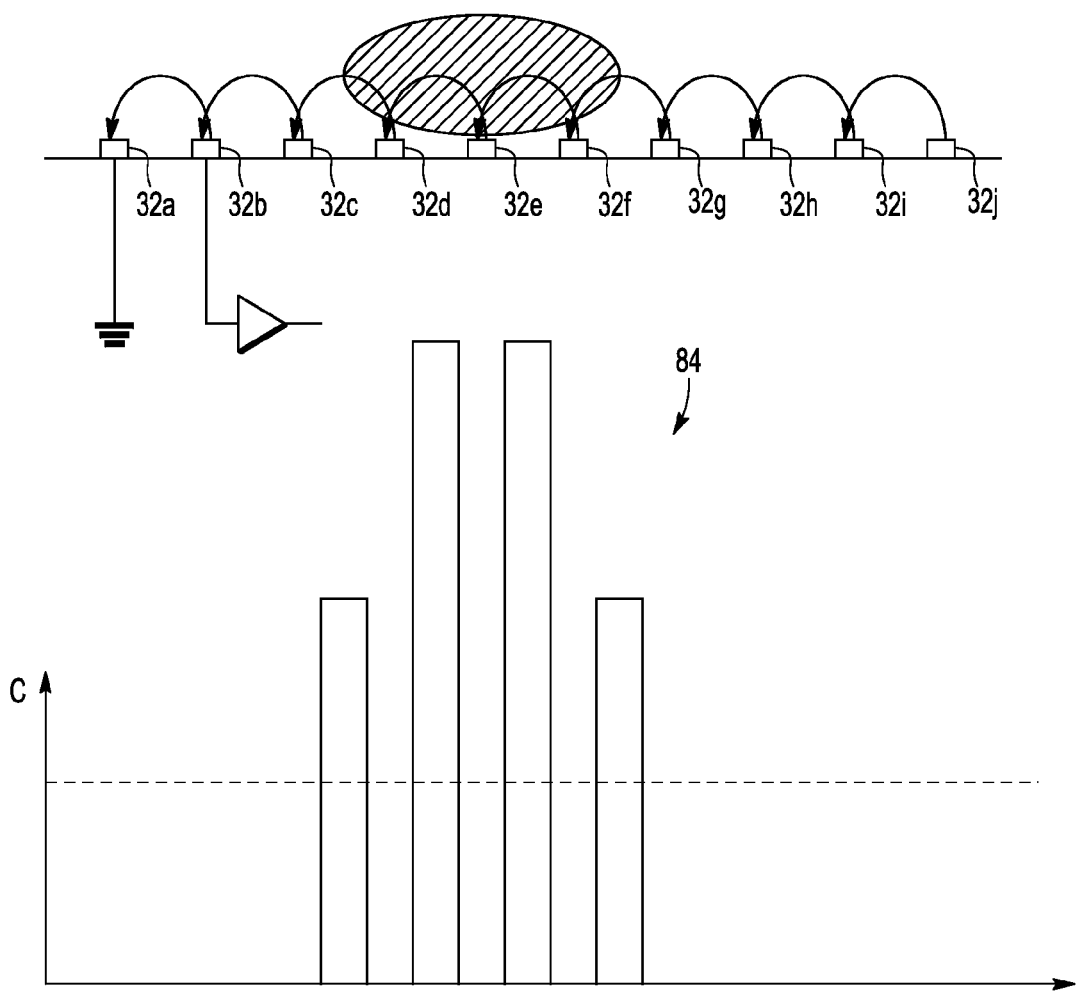
FIG. 12 is an explanatory diagram showing another example of using a plurality of electrodes to generate static capacitance distribution.

Next, with reference to FIGS. 11-13, a process for estimating the size of a foreign object will be described. The object detection device 50 has a function for estimating the size of a foreign object. The control circuit 60 may perform the object detection process in any detection mode. More specifically, the control circuit 60 generates a distribution pattern of the static capacitance in the object detection range corresponding to the plurality of electrodes used in each detection mode. The control circuit 60 compares this generated distribution pattern with a predetermined reference pattern stored in the ROM in order to estimate the size of a foreign object based on the comparison results. FIGS. 11 and 12 illustrate an example of distribution patterns 82 and 84 formed using the plurality of electrodes 32 (using ten (10) electrodes 32a-32j) located on the glass 18 in the horizontal electrode detection mode or variable sensitivity horizontal electrode detection mode.

Figure 13:
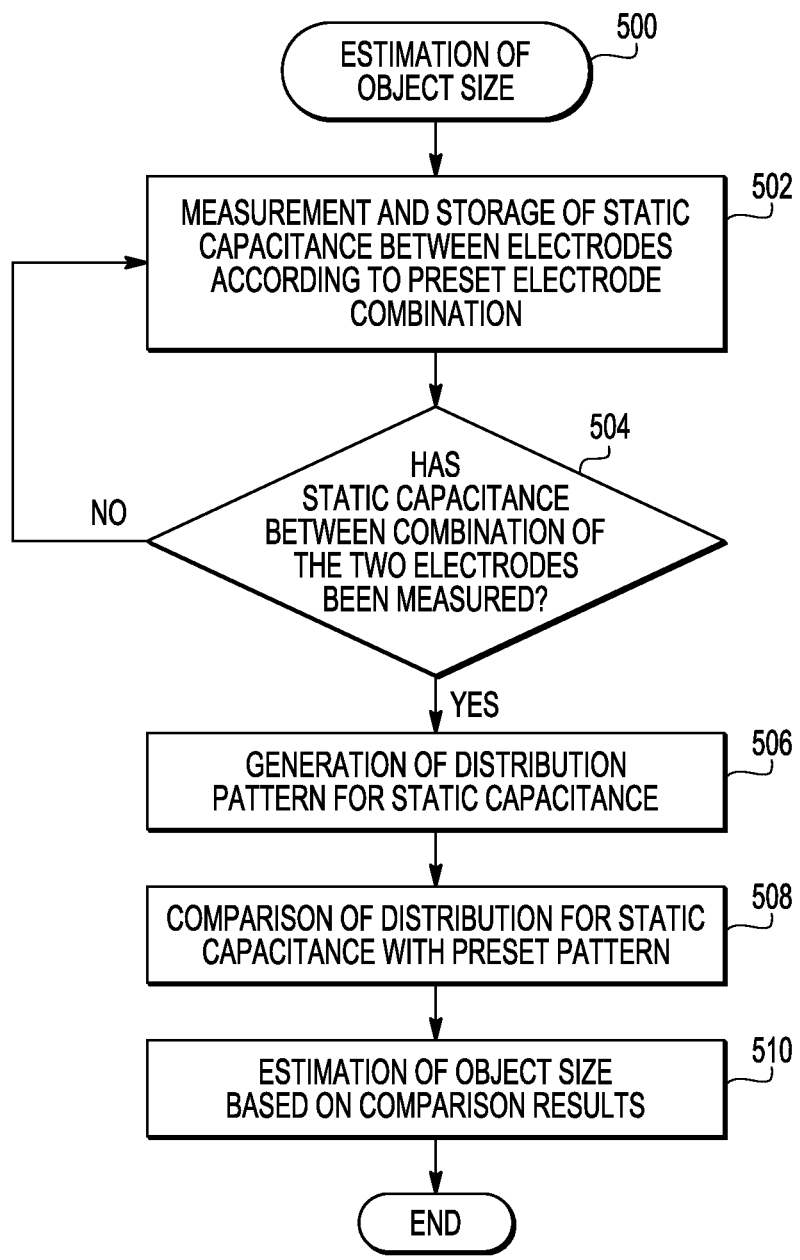
FIG. 13 is a flow chart showing the object size estimation process.

FIG. 13 is a flow chart of the size estimation process performed by the control circuit 60. First in step 502, the control circuit 60 measures and stores the capacitance between the two electrodes of each set based on the detection mode. In step 504, the control circuit 60 determines whether the static capacitance between the two electrodes for each set has been measured. If the measurement of the combination of all electrodes is complete, in step 506, the control circuit 60 generates the distribution pattern of the static capacitance using the measured values (see FIGS. 11 and 12).

Next in step 508, control circuit 60 compares the static capacitance with the set reference capacitance. In step 510, control circuit 60 estimates the size of the object based on the comparison results. The size estimation process allows for the control circuit to determine whether or not the detected object is a rain drop.

The above embodiments may be modified in the following ways.

The detection zones do not have to be predefined. For example, the detection modes do not have to be determined in accordance with predefined detection zones but rather may be defined based on the movement of the glass 18.

There may be 2, 3, 4, or more detection zones.

Use of electrodes 34 on the window frame 16 is not limited to the first detection zone C. For example, the variable sensitivity horizontal electrode mode using electrodes 32 on the glass 18 may also be used in the first detection zone C. In this case, as the glass 18 approaches a foreign object, the dynamic detection in response to the movement of the glass 18 is possible.

The variable sensitivity horizontal electrode mode may use either the electrodes 32 on the glass 18 or the electrodes 34 on the frame 16 and either of these instances of the variable sensitivity horizontal electrode mode may be used for the first detection zone C.

Similarly, use of electrodes 32 on the glass 18 is not limited to the second detection zone B. For example, the variable sensitivity horizontal electrode mode using electrodes 34 on the window frame 16 may be used for the second detection zone B. Furthermore, the variable sensitivity horizontal electrode mode used for electrodes 34 of window frame 16 and the variable sensitivity horizontal electrode mode used for electrodes 32 of the glass 18 may both be used for the second detection zone B. Alternatively, the parallel electrode mode may be used for the second detection zone B.

The variable sensitivity horizontal electrode mode may be used for all detection zones A-C. In this case, the distance between the two selected electrodes will preferably be changed so that detection zone B has a higher sensitivity than detection zone C and detection zone A has a higher sensitivity than detection zone B.

When the glass 18 approaches the window frame 16, the combination of the two electrodes may be switched such that the distance between the two electrodes simply decreases in steps without changing the position of the glass 18.

The object detection device 50 and entrapment prevention device 51 may be applied not only to power window devices but also to automatic doors used in buildings and elevators.

The invention claimed is:

1. An object detection device that detects whether an object is located between a frame and a movable object, which moves relative to the frame, the object detection device comprising:
   three or more first electrodes arranged on at least one of the frame and the movable object;
   an electric field measurement unit connected to the first electrodes to measure the capacitance detected by any of the first electrodes and by any combination of the first electrodes;
   a control circuit connected to the electric field measurement circuit to specify which of the first electrodes and which combinations of the first electrodes are to be used by the electric field measurement unit for measuring capacitance based on movement of the movable object, wherein changing the specified first electrodes used for measuring capacitance varies the sensitivity of the electric field measurement circuit; and
   a position detecting circuit connected to the control circuit to detect the position of the movable object, wherein the control circuit specifies which of the first electrodes to use for measuring capacitance based on the position of the movable object.

2. The object detection device of claim 1, wherein as the distance between the movable object and the frame decreases, the control circuit specifies two of the first electrodes that are close to each other for measuring capacitance, thereby increasing the sensitivity of the electric field measurement circuit as the movable object approaches the frame.

3. The object detection device of claim 1, wherein the control circuit determines a detection zone in which the movable object is located based on the position of the movable object and switches which of the first electrodes are used to measure capacitance based on the detection zone in which the movable object is located.

4. The object detection device of claim 3, wherein the detection zone is one of a plurality of detection zones located in an area in which the movable object moves, and wherein the plurality of detection zones includes:
   a first detection zone located where the movable object is farthest from the frame, which is a first closing position; and
   a second detection zone located between the first detection zone and the frame, which is a second closing position; and
   wherein the control circuit sets the sensitivity of the electric field measurement unit for the second detection zone to be higher than the sensitivity for the first detection zone.

5. The object detection device of claim 4, wherein the first electrodes are arranged on the frame.

6. The object detection device of claim 5, further comprising three or more second electrodes arranged on the movable object and connected to the electric field measurement unit;
   wherein when the movable object is in the first detection zone, the control circuit measures the capacitance between any two of the first electrodes using the electric field measurement circuit, and
   when the movable object is in the second detection zone, the control circuit measures the capacitance between a pair of electrodes with one electrode of the pair selected from the first electrodes and the other electrode of the pair selected from the second electrodes.

7. The object detection device of claim 6, wherein the plurality of detection zones further includes a third detection zone located between the second detection zone and the frame and includes when the movable object contacts the frame, which is a third closing position, and
   wherein the control circuit measures the capacitance between one of the first electrodes and one of the second electrodes when the movable object is in the third detection zone.

8. The object detection device of claim 1, wherein the control circuit switches the two first electrodes so that the space between the two electrodes decreases in steps as the movable object approaches the frame.

9. The object detection device of claim 1, wherein the electric field measurement unit further detects the object based on the capacitance between the object and each of the first electrodes.

10. The object detection device of claim 1, wherein the control circuit generates a capacitance distribution pattern in an object detection range corresponding to the first electrodes, and estimates a size of the object by comparing the generated distributed pattern with one or more predetermined patterns.

11. The object detection device of claim 10, wherein the control circuit determines whether the object is a raindrop based on the comparison.

12. The object detection device of claim 1, wherein the frame is a window frame arranged in a door of an automobile and the movable object is a movable window glass arranged in the window frame.

13. An entrapment prevention device that prevents entrapment of an object between a frame and a movable object, which moves relative to the frame, the device comprising:
- a drive unit that moves the movable object relative to the frame;
- three or more electrodes arranged on at least one of the frame and the movable object;
- an electric field measurement unit connected to the three or more electrodes for determining capacitance measured by various combinations of the three or more electrodes; and
- a control circuit connected to the electric field measurement unit and the drive unit to control the drive unit based on the measured capacitances, and for selecting which ones of the three or more electrodes are used by the electric field measurement unit circuit based on a position of the movable object in order to vary the sensitivity of the electric field measurement unit, wherein the control circuit determines whether the object is a raindrop based on the capacitance measured by the electric field measurement unit and continues moving the movable object towards the frame when the detected object is a raindrop.

14. An entrapment prevention device that prevents entrapment of an object between a frame and a movable object that moves relative to the frame, the device comprising:
- a drive unit that moves the movable object relative to the frame;
- a plurality of first electrodes located on the frame in spaced relation to one another;
- a plurality of second electrodes located on the movable object in spaced relation to one another;
- an electric field measurement unit connected to the pluralities of first and second electrodes for measuring capacitance detected by various combinations of the first and second electrodes; and
- a control circuit connected to the electric field measurement unit for specifying the various combinations of the first and second electrodes used for measuring capacitance, and connected to the drive unit for controlling movement of the movable object within the frame,
- wherein when the movable object is in a first detection zone the control circuit specifies measuring the capacitance using two electrodes of the first plurality of electrodes, when the movable object is in a second detection zone the control circuit specifies measuring the capacitance using two electrodes of the second plurality of electrodes, and when the movable object is in a third detection zone the control circuit specifies measuring the capacitance using at least one pair of electrodes wherein one electrode of the pair is from the plurality of first electrodes and the other electrode of the pair is from the plurality of second electrodes.

* * * * *